United States Patent
Wise et al.

(10) Patent No.: US 12,414,474 B2
(45) Date of Patent: Sep. 9, 2025

(54) METHODS OF FORMING PIEZOELECTRIC MATERIALS, PIEZOELECTRIC DEVICES, AND ASSOCIATED TOOLING AND SYSTEMS

(71) Applicant: Baker Hughes Oilfield Operations LLC, Houston, TX (US)

(72) Inventors: Peter Leonard Wise, Ennis (IE); Aaron Avagliano, Tomball, TX (US); Navin Sakthivel, Spring, TX (US)

(73) Assignee: Baker Hughes Oilfield Operations LLC, Houston, TX (US)

( * ) Notice: Subject to any disclaimer, the term of this patent is extended or adjusted under 35 U.S.C. 154(b) by 754 days.

(21) Appl. No.: 17/507,279

(22) Filed: Oct. 21, 2021

(65) Prior Publication Data
US 2023/0129396 A1    Apr. 27, 2023

(51) Int. Cl.
    *H10N 30/853*    (2023.01)
    *H10N 30/078*    (2023.01)

(52) U.S. Cl.
    CPC ....... *H10N 30/8554* (2023.02); *H10N 30/078* (2023.02)

(58) Field of Classification Search
    CPC ............ H10N 30/8554; H10N 30/078; H10N 30/092; H10N 30/081; H05K 3/125; H05K 1/09; B06B 1/0633; Y10T 29/42; Y10T 29/49155; B41C 1/144
    See application file for complete search history.

(56) References Cited

U.S. PATENT DOCUMENTS

| | | | | |
|---|---|---|---|---|
| 4,309,455 A | * | 1/1982 | Miyagawa | B41C 1/142 205/127 |
| 5,662,040 A | * | 9/1997 | Mori | B41C 1/144 101/116 |

(Continued)

FOREIGN PATENT DOCUMENTS

| | | |
|---|---|---|
| CN | 113320061 A | 8/2021 |
| KR | 10-2000-0009847 A | 2/2000 |

OTHER PUBLICATIONS

Ouyang et al., Photonic Sintering of Aerosol Jet Printed Lead Zirconate Titanate (PZT) Thick Films, J. Am. Ceram. Soc., DOI: 10.1111/jace.14272, (2016), 9 pages.

(Continued)

*Primary Examiner* — Donghai D Nguyen
(74) *Attorney, Agent, or Firm* — Baker Hughes Patent Organization

(57) ABSTRACT

A method of forming a piezoelectric device may include depositing a sol-gel film over a substrate and curing the sol-gel film by impinging light onto an exposed surface of the sol-gel film to form a piezoelectric ceramic element. The method may produce a piezoelectric composite material including at least two piezoelectric ceramic pillars over the substrate. The at least two piezoelectric pillars may include at least one layer. The at least one layer having a gradient density, such that a first portion of the at least one layer proximate the substrate has a density lower than a second portion that is located a greater distance from the substrate than the first portion. The piezoelectric composite material may further include a resin separating the at least two piezoelectric ceramic pillars.

16 Claims, 11 Drawing Sheets

(56) References Cited

U.S. PATENT DOCUMENTS

| | | | | |
|---|---|---|---|---|
| 6,861,203 B2* | 3/2005 | Gelbart | ............... | G03F 7/2018 |
| | | | | 430/935 |
| 7,146,236 B2* | 12/2006 | Silverbrook | ........... | H05K 3/125 |
| | | | | 700/121 |
| 8,628,818 B1* | 1/2014 | Sharma | .................. | H05K 1/09 |
| | | | | 29/829 |
| 8,853,918 B2* | 10/2014 | Krohn | ................. | B06B 1/0622 |
| | | | | 29/25.35 |
| 9,002,496 B2* | 4/2015 | Elsey | ................. | B29C 64/188 |
| | | | | 425/375 |
| 9,461,239 B2* | 10/2016 | Chen | ................... | H10N 30/078 |
| 2013/0076207 A1 | 3/2013 | Krohn et al. | | |
| 2013/0195399 A1 | 8/2013 | Casasanta | | |
| 2017/0072691 A1 | 3/2017 | Hays et al. | | |

OTHER PUBLICATIONS

International Search Report for International Application No. PCT/US2022/078132 dated Feb. 7, 2023, 4 pages.
International Written Opinion for International Application No. PCT/US2022/078132 dated Feb. 7, 2023, 4 pages.

* cited by examiner

METHODS OF FORMING PIEZOELECTRIC MATERIALS, PIEZOELECTRIC DEVICES, AND ASSOCIATED TOOLING AND SYSTEMS

TECHNICAL FIELD

Embodiments of the present disclosure generally relate to methods of forming piezoelectric materials. In particular, embodiments of the present disclosure relate to methods of forming piezoelectric materials, piezoelectric devices, and associated tooling and systems.

BACKGROUND

Piezoelectric materials are materials configured to convert mechanical energy to electrical energy or electrical energy to mechanical energy through the piezoelectric effect. Piezoelectric devices may include sensing devices and/or actuating devices. For example, a piezoelectric sensing device may receive movement, such as vibrations or sound waves and convert the movement to an electrical signal that may be interpreted by an associated processor. A piezoelectric actuator may receive an electrical signal and move based on the electrical signal.

Piezoelectric devices may be used in imaging systems, such as ultrasound systems. For example, a piezoelectric device may be configured to generate the ultrasonic sound waves that travel through the item being imaged (i.e., person, device, formation). Another piezoelectric device may be configured to receive the ultrasonic sound waves and convert the waves to an electrical signal. The imaging system may then generate an image of an internal portion of the item being imaged from the electrical signal. Imaging systems utilizing piezoelectric devices may be used to image earth formations, such as for drilling operations (i.e., oil drilling, water drilling, geothermal drilling, etc.).

BRIEF SUMMARY

Embodiments of the present disclosure may include a method of forming a piezoelectric device. The method may include depositing a sol-gel film over a substrate. The method may further include curing the sol-gel film by impinging light onto an exposed surface of the sol-gel film to form a piezoelectric ceramic element.

Another embodiment of the present disclosure may include a piezoelectric composite material. The material may include at least two piezoelectric ceramic pillars over a substrate, the at least two piezoelectric pillars including at least one layer. The at least one layer having a gradient density, such that a first portion of the at least one layer proximate the substrate has a density lower than a second portion that is located a greater distance from the substrate than the first portion. The material may further include a resin separating the at least two piezoelectric ceramic pillars.

Another embodiment of the present disclosure may include a tool for forming a piezoelectric composite material. The tool may include a substrate support configured to secure a substrate. The tool may further include a first deposition device configured to deposit a sol-gel solution on the substrate. The tool may also include a second deposition device configured to deposit a resin on the substrate. The tool may further include a light configured to cure the sol-gel solution and the resin.

BRIEF DESCRIPTION OF THE DRAWINGS

While the specification concludes with claims particularly pointing out and distinctly claiming embodiments of the present disclosure, the advantages of embodiments of the disclosure may be more readily ascertained from the following description of embodiments of the disclosure when read in conjunction with the accompanying drawings in which:

DETAILED DESCRIPTION

The illustrations presented herein are not meant to be actual views of any particular earth-boring system or component thereof, but are merely idealized representations employed to describe illustrative embodiments. The drawings are not necessarily to scale.

As used herein, the term "substantially" in reference to a given parameter means and includes to a degree that one skilled in the art would understand that the given parameter, property, or condition is met with a small degree of variance, such as within acceptable manufacturing tolerances. For example, a parameter that is substantially met may be at least about 90% met, at least about 95% met, at least about 99% met, or even at least about 100% met.

As used herein, relational terms, such as "first," "second," "top," "bottom," etc., are generally used for clarity and convenience in understanding the disclosure and accompanying drawings and do not connote or depend on any specific preference, orientation, or order, except where the context clearly indicates otherwise.

As used herein, the term "and/or" means and includes any and all combinations of one or more of the associated listed items.

As used herein, the terms "vertical" and "lateral" refer to the orientations as depicted in the figures.

Piezoelectric materials may include ceramic materials, such as lead zirconate titanate (PZT, $Pb[Zr_xTi_{1-x}]O_3$ with $0 \leq x \leq 1$), potassium niobate ($KNbO_3$), sodium tungstate ($Na_2WO_3$), zinc oxide (ZnO), etc., crystalline materials, such as quartz, langasite ($La_3Ga_5SiO_{14}$), gallium orthophosphate ($GaPO_4$), lithium niobate ($LiNbO_3$), lithium tantalate ($LiTaO_3$), lead titanate ($PbTiO_3$), and/or composite materials including piezoelectric ceramic materials or piezoelectric crystalline materials and a polymer, etc. When forming ceramic piezoelectric materials a solution may be formed that may then need to be cured to form the ceramic piezoelectric material. Common curing techniques involve heating (e.g., pyrolysis and sintering) the solution to form the ceramic piezoelectric material. The high temperatures involved in heating the solution may cause lead within the solution and/or ceramic material to volatilize. This is commonly referred to as "lead loss" in the art. Lead loss can reduce the performance of the resulting piezoelectric device by causing a stoichiometric imbalance in the piezoelectric device. The stoichiometric imbalance may reduce the electro-acoustic performance thereof.

The methods described herein may enable piezoelectric devices to be formed from ceramic piezoelectric materials in a manner that significantly reduces the "lead loss" of the associated piezoelectric device. Furthermore, the methods described herein may further increase the efficiency of the piezoelectric device formation, such as by reducing the amount of waste material and/or reducing tooling requirements. This may increase the efficiency of forming high surface area composite structures.

Figure 1:
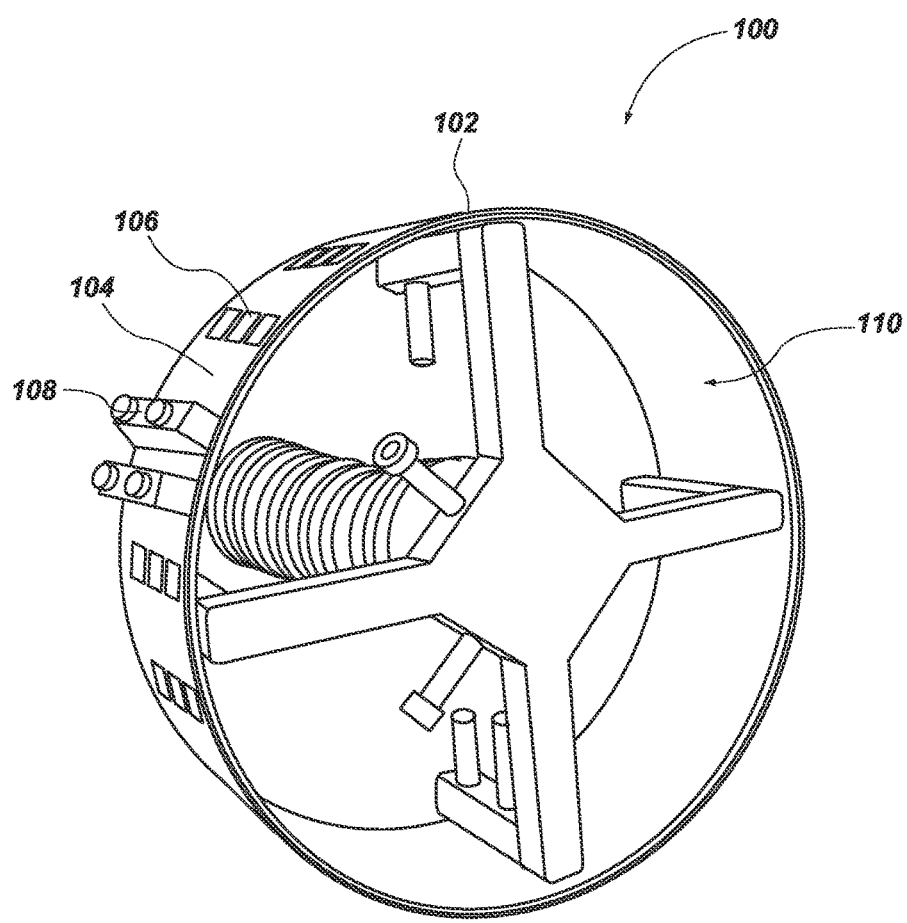
FIGS. 1 through 6 illustrate tooling and process steps of forming a piezoelectric material in accordance with one or more embodiments of the present disclosure.

FIG. 1 illustrates an apparatus 100 for forming multiple piezoelectric elements. The apparatus 100 may include a drum 110 supporting a substrate 102, on which the piezoelectric elements may be formed. A mask 104 may be secured over the substrate 102 with one or more clamping mechanisms 108. The mask 104 may include one or more apertures 106 extending through the mask 104 exposing the substrate 102.

The drum 110 may be a cylindrical support configured to support the substrate 102 on an exterior surface of the drum 110. The drum 110 may be configured to rotate the substrate 102 and mask 104, such that a deposition apparatus may be used to coat the exposed portions of the substrate 102 with a solution. Rotating the drum 110 may enable the deposition apparatus to remain substantially stationary while coating the exposed portions of the substrate 102 about the entire outer surface of the drum 110.

The solution may be deposited on the exposed portions of the substrate 102 through a chemical solution deposition process, such as a sol-gel process. In a sol-gel deposition process a solution including the elements of the desired piezoelectric material may be formed. For example, a solution including lead, zirconium, and titanium (e.g., a solution of zirconium butoxide, titanium butoxide, and lead acetate trihydrate) may be used to create a sol-gel solution for forming a PZT material. In some embodiments, the sol-gel solution may further include a powder, such as a PZT powder (e.g., bismuth titanate, modified bismuth titanate, bismuth scandium lead titanate, lithium niobate and other high temperature piezoelectric powder materials), mixed into the solution. The powder may be fully reacted and dispersed in a sol-gel solution. The powder may reduce the amount of volume lost through pyrolysis when dipping, drying and curing multiple layers. Reducing the volume loss may improve the stability of the sol-gel solution, which may substantially reduce failures of the resulting devices, such as from separation from the substrate, cracks, etc., caused by thermal expansion during the drying and curing processes.

The sol-gel solution may then be deposited onto the mask 104 and substrate 102 through the deposition apparatus, through a process, such as dipping, spraying, sputtering, etc. The deposition apparatus may be configured to create a layer (e.g., film or coating) of the sol-gel solution that is substantially uniform across the surface of the mask 104 and the exposed portions of the substrate 102, as illustrated in FIG. 2.

Figure 2:
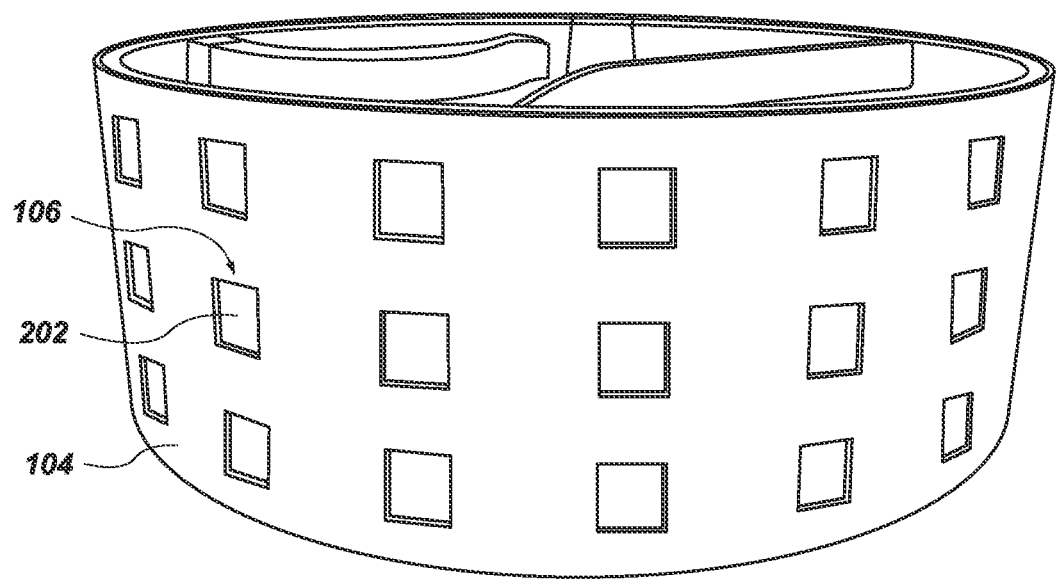

After the mask 104 and exposed portions of the substrate 102 are coated with the sol-gel solution, the drum 110 may be removed and allowed to dry as illustrated in FIG. 2. As the sol-gel solution dries, the sol-gel solution may form a semi-solid or gel-like material, such that the sol-gel solution may remain flexible while remaining in substantially the same position on the mask 104 and substrate 102.

The drying process may remove water and methanol from the sol-gel solution. The removal of the water and methanol may lead to the formation of lead oxide. In some embodiments, the drying process may occur at an elevated temperature, such as a temperature of between about 100° C. and about 600° C. The elevated temperature may increase the amounts of water and methanol removed and may similarly increase the formation of lead oxide. Furthermore, the increased temperature may cause species within the sol-gel to decompose causing crystallization to occur within the sol-gel.

In some embodiments, the elevated temperatures may be staged. For example, a first temperature of between about 150° C. and about 250° C., such as about 200° C., may be used to remove water and methanol and begin forming the lead oxide. A second temperature of between about 270° C. and about 350° C. may cause other species within the sol-gel to decompose. A final temperature of between about 450° C. and about 560° C. may cause pyrochlore and/or perovskite crystallization to occur within the sol-gel material. The crystallization may increase the rigidity of the semi-solid sol-gel material.

The portions of the sol-gel solution in the apertures 106 of the mask 104 may form an element 202 on the substrate 102 that was exposed by the apertures 106 of the mask 104. The element 202 may be a semi-solid element of a substantially uniform thickness supported on the perimeter edges by the walls of the respective apertures 106 of the mask 104.

Each element 202 may have a shape substantially the same as the respective aperture 106. For example, if the aperture 106 has a square shape as illustrated in FIGS. 1-5, the respective element 202 may also have a square shape. In other embodiments, the apertures 106 and respective elements 202 may have other shapes, such as triangular shapes, rectangular shapes, circular shapes, etc.

Figure 3:
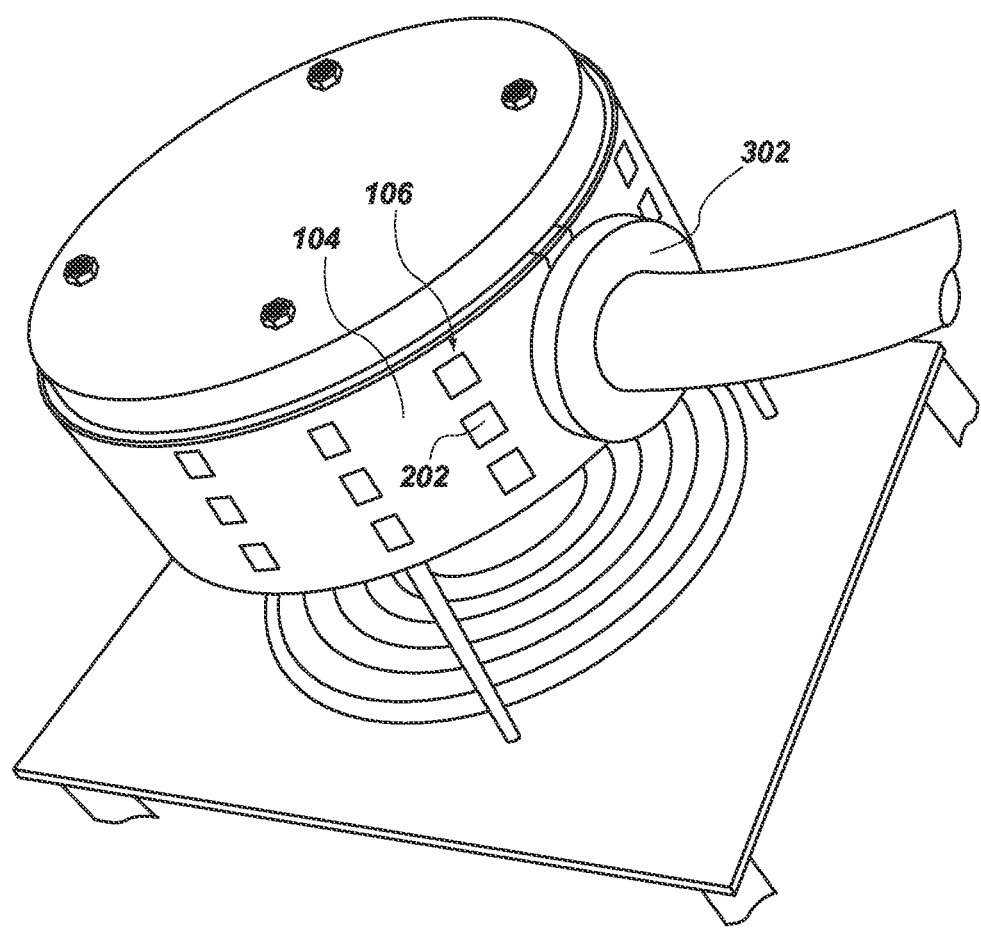
Figure 4:
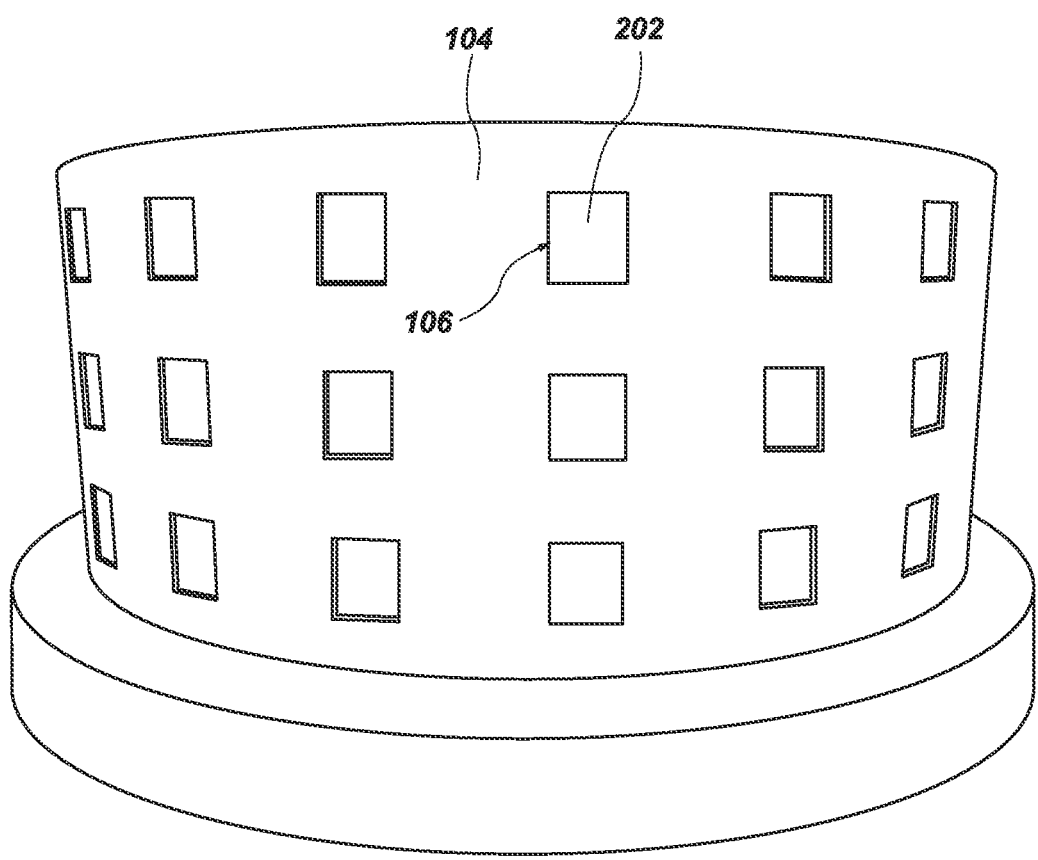

After the sol-gel solution is dried, the mask 104 and exposed portions of the substrate 102 that are coated with the sol-gel solution may be cooled as illustrated in FIG. 3. A cooling apparatus 302 may be configured to cool the sol-gel solution. The cooling apparatus 302 may include one or more of a ventilation system, a refrigerant system, a cold plate, etc. Cooling the sol-gel solution may further solidify the sol-gel solution both on the mask 104 and in the elements 202 within the apertures 106 of the mask 104.

After the sol-gel solution is dried and cooled, a second layer of sol-gel solution may be deposited over the dried and cooled sol-gel solution. The second layer of sol-gel solution may go through substantially the same processing steps as the first sol-gel solution layer going through both a drying and a cooling step. The same processing steps may be repeated until the element 202 reaches a desired thickness. For example, the processing steps may be repeated until the element 202 reaches a thickness of between about 9 μm and about 500 μm, such as between about 50 μm and about 200 μm.

The thickness of the element 202 may substantially correlate to a final thickness of the resulting ceramic material in the piezoelectric device. The thickness of the ceramic material in the piezoelectric device may affect the performance of the piezoelectric device. For example, a thinner ceramic material may be more responsive to electrical signals and/or movement, whereas a thicker ceramic material may be more robust and able to withstand greater amounts of movement and/or larger electrical signals. For audio devices, such as ultrasound imaging devices a thinner ceramic material may enable the use of higher frequencies (i.e., the thinner ceramic material may be able to detect and/or produce higher frequencies).

Figure 5:
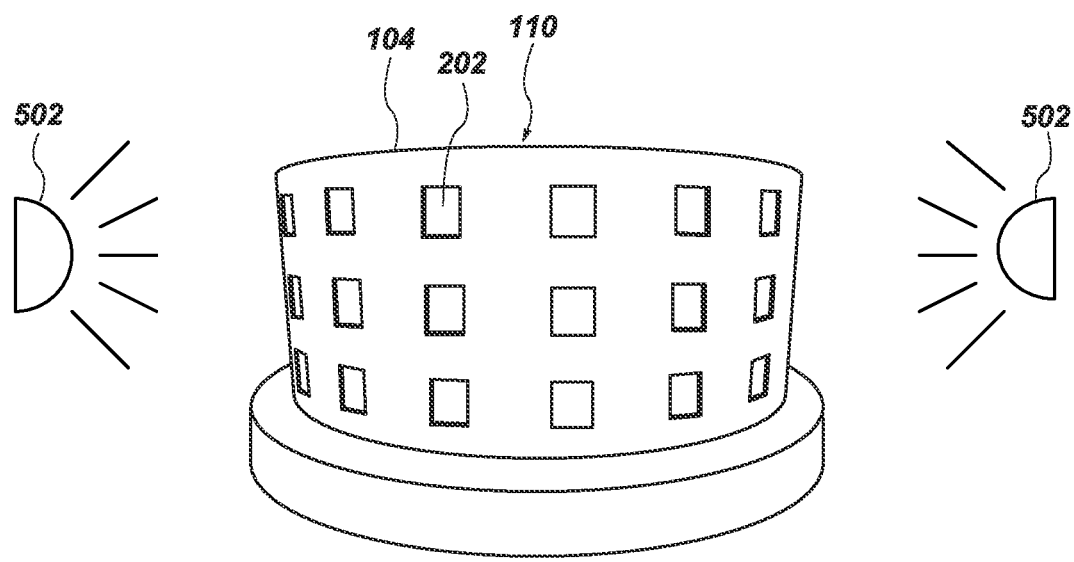

Once the desired thickness is reached, the sol-gel solution may be cured as illustrated in FIG. 5. Curing the sol-gel solution may cause the sol-gel solution to calcine and solidify into a substantially rigid ceramic material, such as PZT. The sol-gel solution may be cured by impinging a light 502 on the sol-gel solution. The light 502 may be in the ultraviolet or visible spectrums, such as light having wavelengths of between about 100 nanometers (nm) and about 800 nm, such as between about 200 nm and about 600 nm, or between about 300 nm and about 500 nm. The light 502 may cause the sol-gel solution to calcine without heating the sol-gel solution to high temperatures (e.g., temperatures of greater than about 700° C.). As described above, reducing the curing temperature may reduce the amounts of lead loss experienced by the ceramic material during the curing process.

In some embodiments, the drum 110 with the substrate 102, mask 104, and elements 202 may be placed in an enclosed area, such as a box surrounded by lights configured to emit light in the ultraviolet or visible spectrum, such that the light may impinge on the sol-gel solution deposited over the substrate 102 and mask 104.

The light 502 may impinge on the surface of the sol-gel solution for a time period between about 1 s and about 1 hr, such as between about 1 s and about 120 s. The time period may be determined based on parameters such as material thickness, capacitor bank voltage, pulse length, pulse repetition rate, pulse number, average power exposure, etc.

Figure 6:
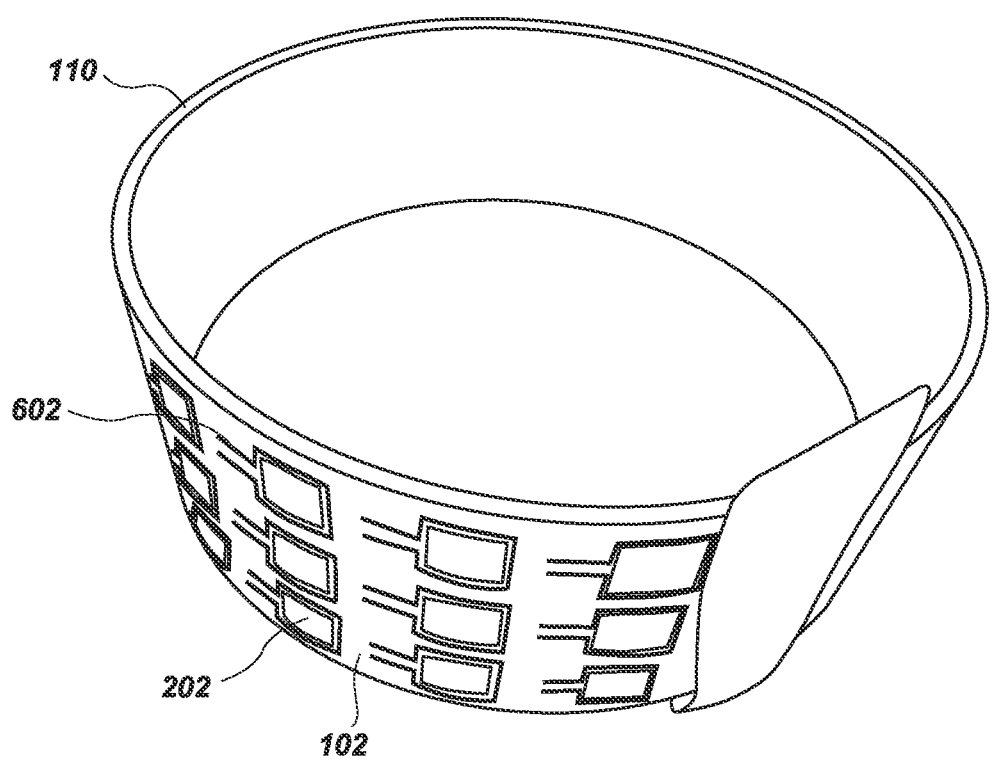
Figure 7:
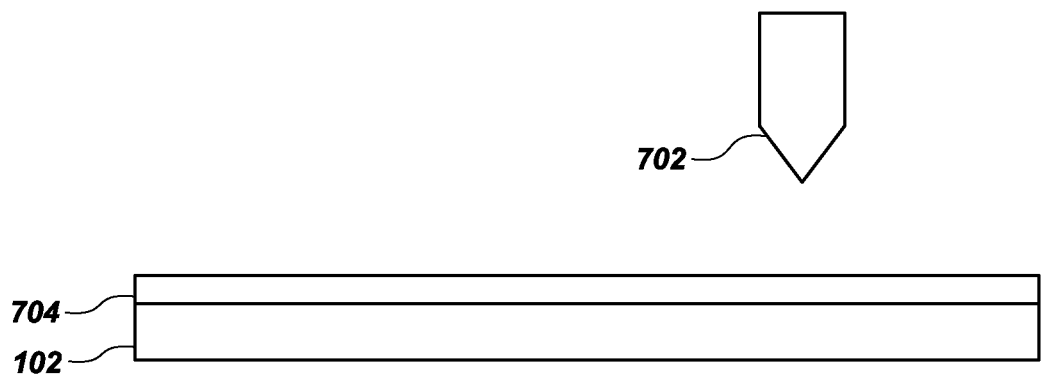
FIGS. 7 through 10 illustrate process steps for forming a piezoelectric material in accordance with one or more embodiments of the present disclosure.

After the sol-gel solution is cured forming the ceramic material, the process may be repeated to form multiple layers of ceramic material until a desired thickness is reached. After the multiple layers of ceramic material are created, the mask 104 may be removed as illustrated in FIG. 6. FIG. 6 illustrates the substrate 102 over the drum 110 with the elements 202 formed thereon. The cured elements 202 may have a thickness of between about 5 µm and about 40 µm, such as between about 9 µm and about 12 µm.

The substrate 102 may be formed from a substantially heat resistant and flexible material, such as a metal (e.g., stainless steel) or a polymer. The substrate 102 may include contacts 602 formed on the surface of the substrate 102. For example, the contacts 602 may be formed from a conductive material, such as copper or gold, in a process step before forming the elements 202. The contacts 602 may be formed in a process such as sputtering. After the contacts 602 are formed the elements 202 may be formed over the contacts, in any of the processes described herein. In some embodiments, the substrate 102 may be a conductive material, such that the substrate 102 may form an electrode for the resulting piezoelectric material. After the elements 202 are formed a top contact may be formed over the elements 202, such as through an additional sputtering process.

In some embodiments, the piezoelectric ceramic material may be formed without using a mask 104. FIG. 7 through FIG. 10 illustrate an example of a method of forming the piezoelectric ceramic material over the substrate 102 without a mask 104. First, a sol-gel layer 704 (e.g., film, coating, etc.) may be formed over the substrate 102. Similar to the process described above, the sol-gel layer 704 may be formed through a deposition device 702, such as a spraying device, a sputtering device, a dipping device (e.g., dipping the substrate 102 into a sol-gel solution), etc.

In some embodiments the sol-gel layer 704 may be formed of multiple layers of sol-gel solution. For example, a first layer may be applied and allowed to dry before a second layer may be applied over the first layer. The application may be repeated until the sol-gel layer 704 reaches the desired thickness. As described above, the drying process may occur at an elevated temperature. In other embodiments, the drying process may occur at a temperature close to a typical room temperature.

Figure 8:
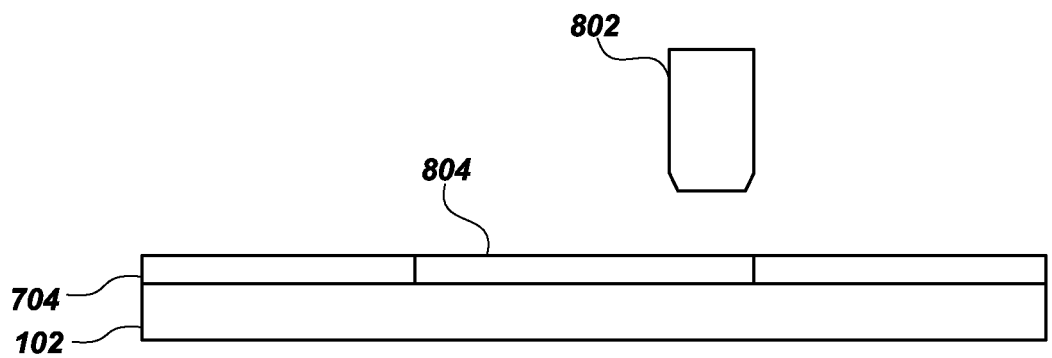

After the sol-gel layer 704 is formed a light 802 may be used to selectively cure a portion of the sol-gel layer 704 to form a ceramic element 804 as illustrated in FIG. 8. The light 802 may be a focused light, such as a laser, configured to control the area upon which the light 802 impinges. Focusing the light may enable the light 802 to be used to define the shape of the ceramic element 804 by selectively curing the sol-gel layer 704 in the area where the ceramic element 804 is desired and leaving the sol-gel layer 704 outside the ceramic element 804 substantially uncured.

The light 802 may be in the ultraviolet or visible spectrums, such as light having wavelengths of between about 100 nm and about 800 nm, such as between about 200 nm and about 600 nm, or between about 300 nm and about 500 nm. The light 802 may cause the sol-gel solution in the selected area to calcinate. For example, the focused light 802 may excite the sol-gel solution raising the local temperature to the calcination temperature without raising the temperature surrounding the sol-gel solution. Raising the local temperature may cause the area of the sol-gel solution in direct contact with the focused light 802 to calcinate, sintering the sol-gel solution into the ceramic element 804 without heating the area around the sol-gel solution.

In some embodiments, the light 802 may be used to execute all of the drying and curing processes for forming the ceramic element 804. For example, as described above, different elevated temperatures may produce different effects in the curing process of the sol-gel layer 704. The light 802 may be used to create local elevated temperatures for similar effects, such as removing water and methanol and beginning to form the lead oxide, causing other species within the sol-gel to decompose, and causing pyrochlore and/or perovskite crystallization to occur within the sol-gel material. Curing and/or drying the ceramic element 804 with the light may create a density gradient within the ceramic element 804, such that the density of the ceramic element 804 may be different at different locations in the ceramic element 804. For example, the density of the ceramic element 804 proximate the substrate 102 may be less than the density of the ceramic element proximate an upper surface of the ceramic element 804 that is on an opposite side of the ceramic element from the substrate 102.

As described above, reducing the heat in the areas around the sol-gel material may substantially reduce the lead loss experienced by the sol-gel solution during the curing process. Furthermore, reducing the heat in the areas around the sol-gel solution may enable materials with a lower tolerance for high temperatures to be used in conjunction with the piezoelectric ceramic materials, such as for substrates and/or contacts on the substrates.

In some embodiments, the ceramic element 804 may be formed from multiple sol-gel layers 704. For example, a first sol-gel layer 704 may be deposited and cured as described above. After the first sol-gel layer 704 is formed and selectively cured, a second sol-gel layer 704 may be formed over the first sol-gel layer 704. The second sol-gel layer 704 may also be selectively cured by the light 802 as described above. The process may be repeated until the ceramic element 804 reaches a desired thickness.

In some cases, each layer may only be partially cured before the ceramic element 804 reaches the desired thickness. For example, the light 802 may induce one or more of the intermediate drying/curing effects described above, such as removing water and methanol and beginning to form the lead oxide, causing other species within the sol-gel to decompose, and/or causing pyrochlore and/or perovskite crystallization to occur within the sol-gel material, without causing the respective sol-gel layer 704 to calcinate and fully sinter into the ceramic element 804. In other cases, each layer may be fully cured or sintered before the next layer is applied.

Figure 9:
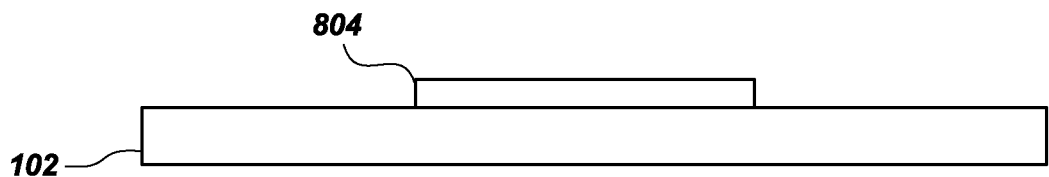
Figure 10:
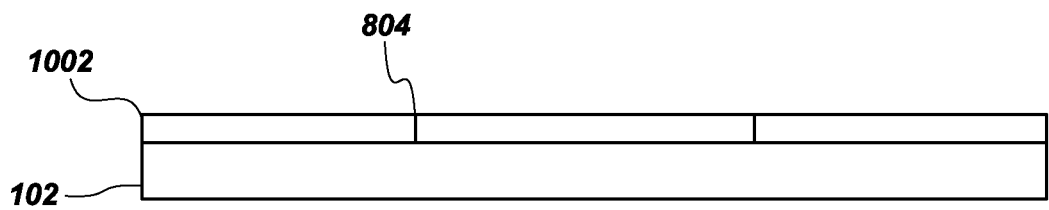
Figure 11:
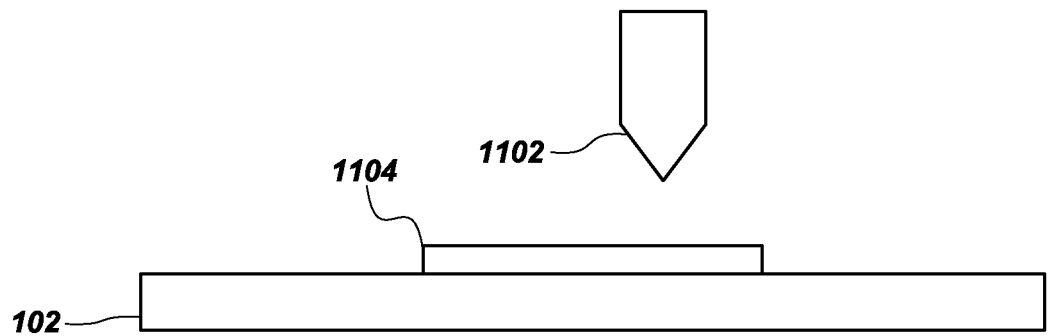
FIGS. 11 through 15 illustrate process steps for forming a piezoelectric material in accordance with one or more embodiments of the present disclosure.

After the ceramic element 804 is cured by the light 802, the remaining sol-gel layer 704 may be removed as illustrated in FIG. 9. For example, the remaining sol-gel layer 704 may be removed by washing the substrate 102, such as in a water or solvent bath. The washing process may be configured to remove the uncured sol-gel layer 704 while leaving the cured ceramic element 804 substantially unaffected. Thus, after the washing process, the ceramic element 804 may remain over the substrate 102.

After the remaining sol-gel layer 704 is removed from the area surrounding the ceramic element 804, a resin 1002 may be deposited around the ceramic element 804. The resin 1002 may be an epoxy resin or a UV curable resin. In some embodiments, as further described below, the substrate 102 may include an array of multiple ceramic elements 804 separated by the resin 1002 to form a piezoelectric composite material. Forming the piezoelectric composite material in the manner described above, may enable smaller scale composite structures. For example, the composite structures may have a kerf width (e.g., distance between ceramic elements 804) of between about 15 um and about 380 um and a pitch (e.g., distance from a first side of a ceramic element 804 to a first side of an adjacent ceramic element 804) of between about 70 um and about 850 um.

FIG. 11 through FIG. 15 illustrate another example of a method of forming the piezoelectric ceramic material over the substrate 102 without a mask 104. A first sol-gel layer 1104 may be formed over the substrate 102. The first sol-gel layer 1104 may be formed by a sol-gel deposition device 1102 configured to selectively deposit the first sol-gel layer 1104. For example, the sol-gel deposition device 1102 may be a deposition head similar to a printing head of a 3-D printer configured to deposit the first sol-gel layer 1104 in a specific pattern over the substrate 102.

The sol-gel deposition device 1102 may move over the substrate 102 or the substrate 102 may move relative to the sol-gel deposition device 1102, such that the sol-gel deposition device 1102 may travel in a grid pattern relative to the substrate 102 only depositing the first sol-gel layer 1104 in the regions where the piezoelectric ceramic material is desired and leaving the other portions of the substrate 102 substantially free of the sol-gel material.

Figure 12:
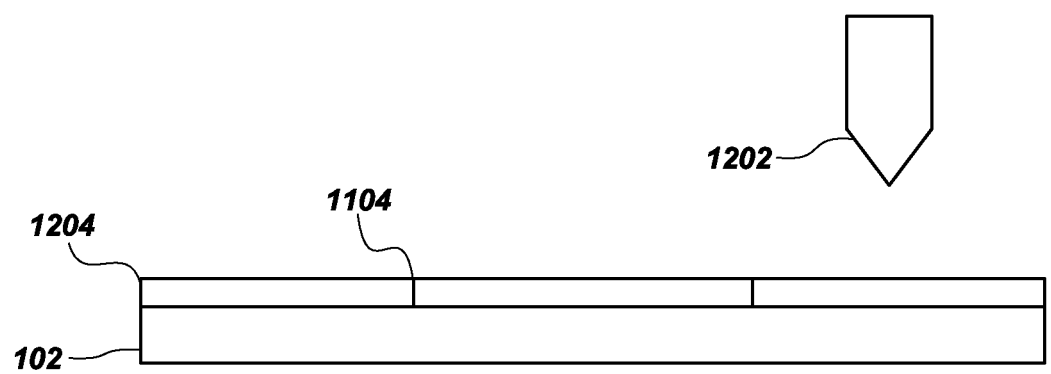

As illustrated in FIG. 12, a resin deposition device 1202 may be configured to deposit a first resin layer 1204 over the substrate 102 in the regions that are substantially free of the first sol-gel layer 1104. The first resin layer 1204 may include a resin material, such as an epoxy resin or a UV curable resin. For example, the first resin layer 1204 may be formed from a resin configured to cure under lights having wavelengths in the ultraviolet spectrum.

In some embodiments, the resin deposition device 1202 may be configured to operate simultaneously with the sol-gel deposition device 1102. For example, a deposition head may include both the sol-gel deposition device 1102 and the resin deposition device 1202, such that as the deposition head moves relative to the substrate 102 the deposition head may selectively deposit sol-gel from the sol-gel deposition device 1102 or resin from the resin deposition device 1202 based on a location on the substrate 102.

In other embodiments, the resin deposition device 1202 may be configured to operate separately from the sol-gel deposition device 1102. For example, the sol-gel deposition device 1102 may move independently from the resin deposition device 1202 (e.g., on a separate deposition head). In some cases, the sol-gel deposition device 1102 may deposit the first sol-gel layer 1104 before the resin deposition device 1202 deposits the first resin layer 1204. In other cases, the sol-gel deposition device 1102 may deposit the first sol-gel layer 1104 at substantially the same time as the resin deposition device 1202 deposits the first resin layer 1204, however, the sol-gel deposition device 1102 may move independently from the resin deposition device 1202, such as along different paths, or in different areas.

Figure 13:
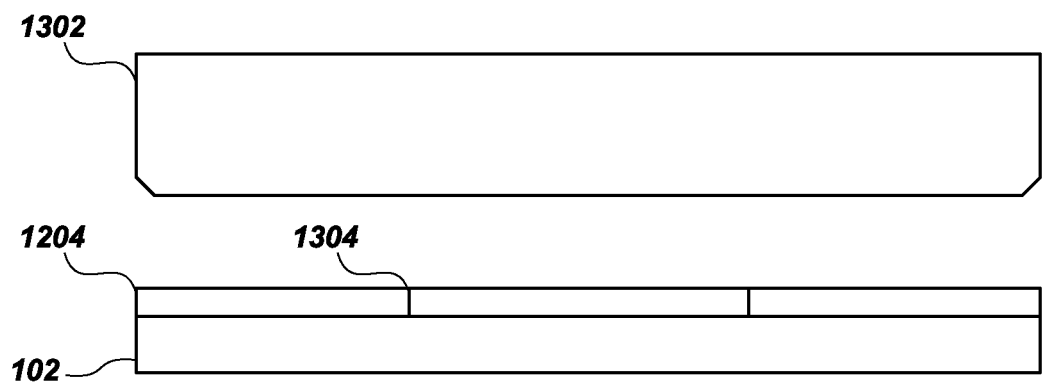

After the first resin layer 1204 and the first sol-gel layer 1104 are deposited over the substrate 102, a light 1302 may be used to cure the first resin layer 1204 and the first sol-gel layer 1104 as illustrated in FIG. 13. As described above, the light 1302 may cure the first sol-gel layer 1104 to form a first ceramic layer 1304 by removing water and methanol, beginning to form the lead oxide, causing other species within the sol-gel to decompose, causing pyrochlore and/or perovskite crystallization to occur within the sol-gel material, and/or causing the first sol-gel layer 1104 to calcinate and fully sinter into the first ceramic layer 1304.

As described above, the first resin layer 1204 may be a resin configured to cure under ultraviolet light. Therefore, the light 1302 may be configured to produce light having wavelengths within the ultraviolet spectrum, such that the light 1302 may be configured to cure both the first sol-gel layer 1104 and the first resin layer 1204 substantially simultaneously. For example, the light 1302 may produce light having wavelengths between about 100 nm and about 400 nm, such as wavelengths between about 300 nm and about 400 nm.

Figure 14:
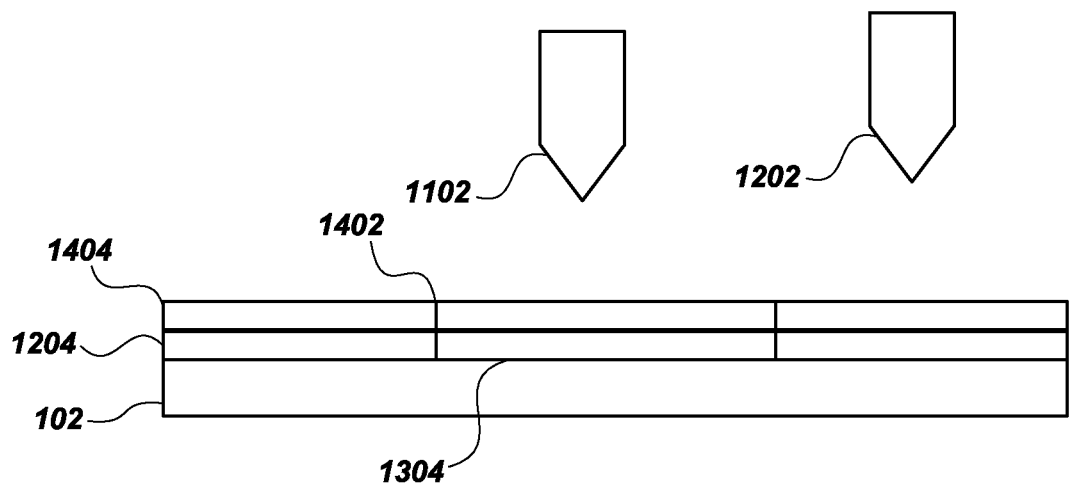

After the first resin layer 1204 and the first ceramic layer 1304 are cured, the sol-gel deposition device 1102 and the resin deposition device 1202 may deposit a second sol-gel layer 1402 and a second resin layer 1404 over the first resin layer 1204 and the first ceramic layer 1304, as illustrated in FIG. 14. The second sol-gel layer 1402 and the second resin layer 1404 may be deposited in substantially the same manner as the first sol-gel layer 1104 and the first resin layer 1204, as described above.

Figure 15:
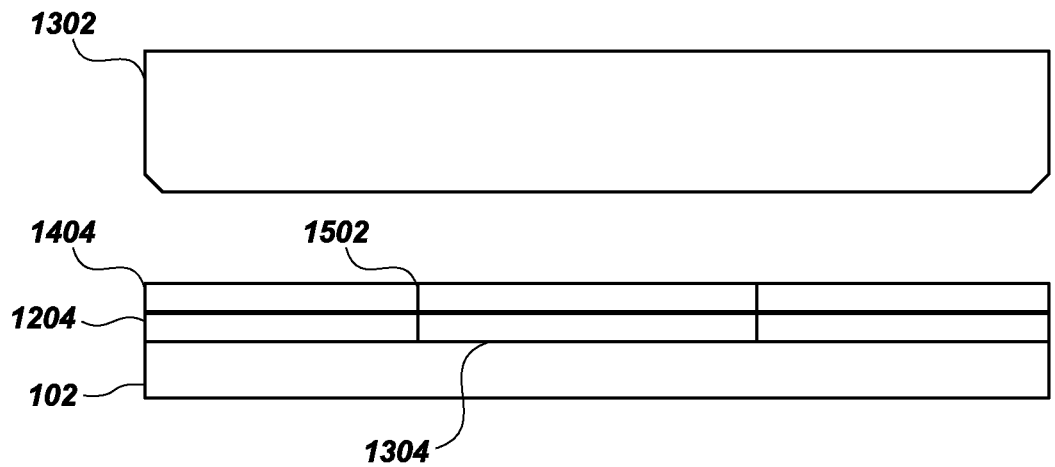

After the second sol-gel layer 1402 and the second resin layer 1404 are deposited over the first resin layer 1204 and first ceramic layer 1304, the light 1302 may be used to cure the second sol-gel layer 1402 and the second resin layer 1404 as illustrated in FIG. 15. As described above, the light 1302 may cure the second sol-gel layer 1402 to form a second ceramic layer 1502 by forming lead oxide, causing other species within the sol-gel to decompose, causing pyrochlore and/or perovskite crystallization to occur within the sol-gel material, and/or causing the second sol-gel layer 1402 to calcinate and fully sinter into the second ceramic layer 1502.

As described above, the second resin layer 1404 may be a resin configured to cure under ultraviolet light. Therefore, the light 1302 may be configured to produce light having wavelengths within the ultraviolet spectrum, such that the light 1302 may be configured to cure both the second resin layer 1404 and the second sol-gel layer 1402 substantially simultaneously.

Figure 16:
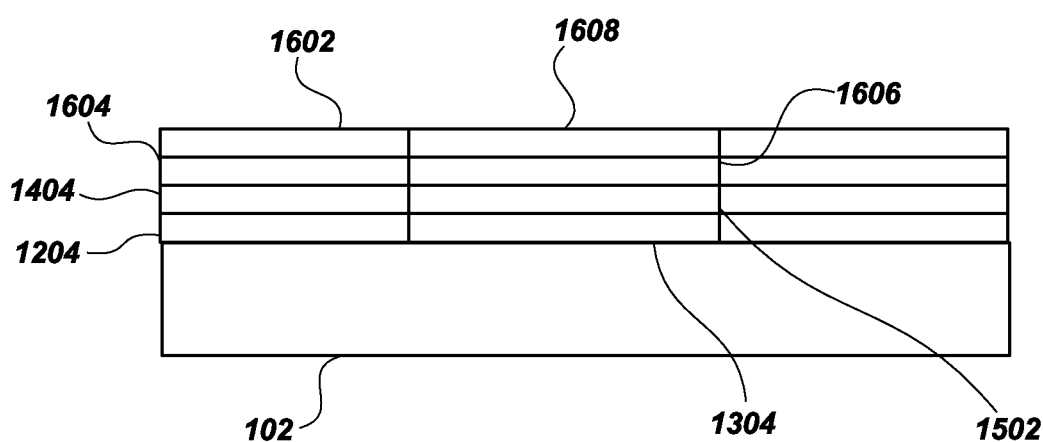
FIG. 16 illustrates a cross-sectional view of an embodiment of a piezoelectric device formed in accordance with one or more of the processes described in the present disclosure.

The processes of depositing layers the sol-gel material and the resin and curing the sol-gel and resin layers may be repeated until a device having the desired thickness is formed as illustrated in FIG. 16. The final device may include multiple layers of resin 1204, 1404, 1604, 1602 and multiple layers of ceramic, 1304, 1502, 1606, 1608.

Curing each of the layers independently with the light 1302 as described above, may result in the ceramic layers 1304, 1502, 1606, 1608 having substantially the same density. Each of the ceramic layers 1304, 1502, 1606, 1608 may have a density gradient as described above, such that a portion each of the ceramic layers 1304, 1502, 1606, 1608 nearer (e.g., proximate) the substrate 102 may have a lower density that the portions of each of the ceramic layers 1304, 1502, 1606, 1608 that are further from the substrate 102. The light 1302 may impinge on the top of each layer, such that intensity of the light may reduce as the light travels through each ceramic layer. The reduction in the intensity of the light may result in a reduction in the density of the lower portions of the ceramic layers 1304, 1502, 1606, 1608.

Figure 17:
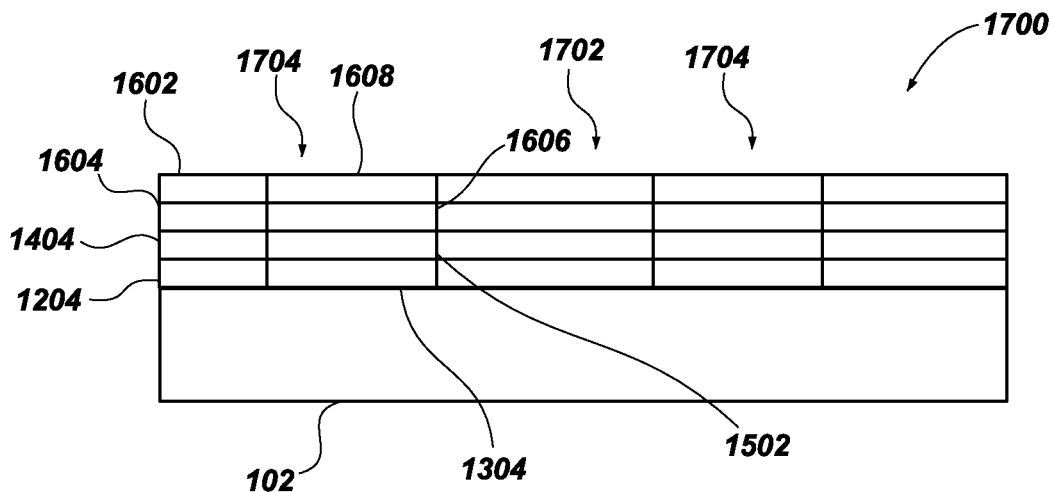
FIG. 17 illustrates a cross-sectional view of an embodiment of a piezoelectric composite material including the piezoelectric device of FIG. 16.
Figure 18:
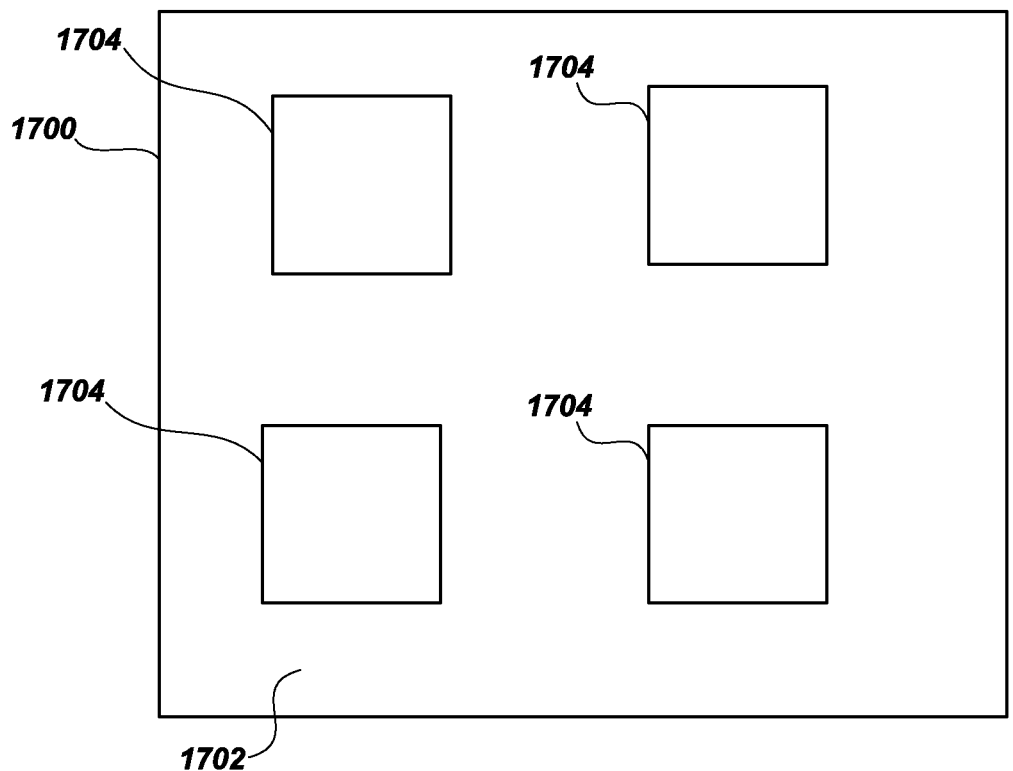
FIG. 18 illustrates a top view of an embodiment of the piezoelectric composite material of FIG. 17.

The ceramic layers 1304, 1502, 1606, 1608 may combine to form one or more pillars 1704 over the substrate 102, as illustrated in FIG. 17. The pillars 1704 may be separated by resin 1702 (i.e., the layers of resin 1204, 1404, 1604, 1602). A pattern of pillars 1704 may form an array as illustrated in FIG. 18. The array of pillars 1704 separated by resin 1702 may form a piezoelectric composite material 1700. The pillars 1704 may be electrically coupled to one another through contacts formed on the substrate 102, such as the contacts 602 described above. The contacts may enable the pillars 1704 to generate an electrical signal from the piezoelectric composite material 1700 and/or respond to an electrical signal applied to the piezoelectric composite material 1700. In some embodiments, as described above, the substrate 102 may be formed from a conductive material, such that the substrate 102 may form an electrical connection between the pillars 1704 and act as an electrode for the piezoelectric composite material 1700.

Embodiments of the present disclosure may enable a piezoelectric material to be formed without high temperature sintering. Forming the piezoelectric material without high temperature sintering may reduce the amount of lead loss during the curing process, which may result in higher performance materials. Furthermore, reducing the processing temperatures may enable the use of materials having a lower tolerance for heat, such as for substrates, contacts, resins, etc.

The embodiments of the disclosure described above and illustrated in the accompanying drawing figures do not limit the scope of the invention, since these embodiments are merely examples of embodiments of the invention, which is defined by the appended claims and their legal equivalents. Any equivalent embodiments are intended to be within the scope of this disclosure. Indeed, various modifications of the present disclosure, in addition to those shown and described herein, such as alternative useful combinations of the elements described, may become apparent to those skilled in the art from the description. Such modifications and embodiments are also intended to fall within the scope of the appended claims and their legal equivalents.

What is claimed is:

1. A method of forming a piezoelectric device comprising:
   applying a substrate over a cylindrical surface of a body of a drum;
   applying a mask over the substrate around the cylindrical surface of the body of the drum;
   depositing a sol-gel film including a piezoelectric material over the substrate through openings defined in the mask;
   curing the sol-gel film by impinging light onto an exposed surface of the sol-gel film to form a piezoelectric ceramic element.

2. The method of claim 1, wherein the light has a wavelength between about 800 nanometers (nm) and about 100 nm.

3. The method of claim 1, wherein the sol-gel film is deposited over the mask positioned over the substrate, the openings configured to enable the sol-gel film to pass through the openings to the substrate.

4. The method of claim 1, wherein the light is selectively impinged over a portion of the sol-gel film, such that the portion of the sol-gel film where the light is selectively impinged forms the piezoelectric ceramic element.

5. The method of claim 1, wherein the sol-gel film is selectively deposited over the substrate, such that a portion of the substrate is substantially free from the sol-gel film.

6. The method of claim 5, further comprising depositing a resin over the portion of the substrate that is substantially free from the sol-gel film.

7. The method of claim 6, wherein the resin is an ultraviolet curable resin.

8. The method of claim 1, further comprising depositing a second sol-gel film over the sol-gel film to form a second layer.

9. The method of claim 8, wherein the second sol-gel film is deposited after curing the sol-gel film.

10. The method of claim 1, wherein the sol-gel film comprises a solution of zirconium butoxide, titanium isoproxide, and lead acetate trihydrate.

11. The method of claim 10, wherein the sol-gel film comprises a PZT powder.

12. A tool for forming a piezoelectric composite material comprising:
    a substantially cylindrical substrate support configured to secure a substrate;
    a mask configured to clamp the substrate to the cylindrical substrate support, the mask defining openings configured to expose the substrate beneath the mask;
    a first deposition device configured to deposit a sol-gel solution on the substrate through the openings defined in the mask;
    a second deposition device configured to deposit a resin on the substrate; and
    a light configured to cure the sol-gel solution and the resin.

13. The tool of claim 12, wherein the second deposition device is configured to deposit the resin at substantially a same time as the first deposition device deposits the sol-gel solution.

14. The tool of claim 12, wherein the first deposition device and the second deposition device are configured to move independent of one another.

15. The tool of claim 12, wherein the first deposition device and the second deposition device are coupled to a single deposition head.

16. The tool of claim 12, wherein the light is configured to output light in wavelengths between about 800 nanometers (nm) and about 100 nm.

* * * * *